United States Patent
Nariman et al.

[11] Patent Number: 6,096,643
[45] Date of Patent: Aug. 1, 2000

[54] METHOD OF FABRICATING A SEMICONDUCTOR DEVICE HAVING POLYSILICON LINE WITH EXTENDED SILICIDE LAYER

[75] Inventors: Homi E. Nariman; H. Jim Fulford; Charles E. May, all of Austin, Tex.

[73] Assignee: Advanced Micro Devices, Inc., Sunnyvale, Calif.

[21] Appl. No.: 09/164,956

[22] Filed: Oct. 1, 1998

[51] Int. Cl.⁷ .................................................. H01L 21/44
[52] U.S. Cl. .......................... 438/666; 438/197; 438/652; 438/655; 438/656; 257/508
[58] Field of Search ................................ 438/197, 151, 438/154, 201, 239, 618, 637, 652, 655, 656, 666, 682, 683; 257/67, 69, 508

[56] References Cited

U.S. PATENT DOCUMENTS

| | | | |
|---|---|---|---|
| 5,612,552 | 3/1997 | Owens | 257/202 |
| 5,661,056 | 8/1997 | Takeuchi | 438/261 |
| 5,691,212 | 11/1997 | Tsai et al. | 437/24 |
| 5,828,102 | 10/1998 | Bergemont | 257/342 |
| 5,854,127 | 12/1998 | Pan | 438/629 |
| 5,869,396 | 2/1999 | Pan et al. | 438/647 |
| 5,880,033 | 3/1999 | Tsai | 438/710 |
| 5,880,035 | 3/1999 | Fukuda | 438/734 |
| 5,880,505 | 3/1999 | Fujii et al. | 257/383 |
| 5,915,181 | 6/1999 | Tseng | 438/289 |
| 5,923,988 | 7/1999 | Cheng et al. | 438/305 |
| 5,935,766 | 8/1999 | Cheek et al. | 430/316 |
| 5,945,738 | 8/1999 | Nguyen et al. | 257/756 |
| 5,949,092 | 9/1999 | Kadosh et al. | 257/67 |
| 5,953,612 | 9/1999 | Lin et al. | 438/299 |
| 5,966,597 | 10/1999 | Wright | 438/197 |
| 5,966,600 | 10/1999 | Hong | 438/253 |
| 5,966,607 | 10/1999 | Chee et al. | 438/305 |

OTHER PUBLICATIONS

S. M. Ku, Ohmic Contacts For Small, Shallow Structure Devices, IBM Technical Disclosure Bulletin, 1487–1488, Sep. 1979.

*Primary Examiner*—Matthew Smith
*Assistant Examiner*—Robert A. Hullinger

[57] ABSTRACT

A semiconductor device and fabrication process are provided in which a polysilicon line is disposed on a substrate of the semiconductor device. The polysilicon line may, for example, be a gate electrode. A dielectric layer is disposed adjacent the polysilicon line and an extended silicide layer is formed over the polysilicon line. The extended silicide layer may be formed by forming a patterned metal layer over the polysilicon line, forming a polysilicon layer over the patterned metal layer, and reacting the patterned metal layer with the polysilicon layer to form the extended silicide layer over the polysilicon line. The device may further include a second polysilicon line, such as a gate electrode, and the silicide layer may extend over the top of the second polysilicon line and interconnects the two polysilicon lines.

11 Claims, 5 Drawing Sheets

METHOD OF FABRICATING A SEMICONDUCTOR DEVICE HAVING POLYSILICON LINE WITH EXTENDED SILICIDE LAYER

FIELD OF THE INVENTION

The present invention is directed generally to semiconductor devices and, more particularly, to a semiconductor device having one or more polysilicon lines with an extended silicide layer and a method of forming such a semiconductor device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 is typically a polysilicon line which acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as SiO2. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

In a completed device structure, the source/drain regions 105 and gate electrode 103 (as well as other types of polysilicon lines) are typically contacted by metal contacts in order to interconnect these structures with other elements of the device. Prior to forming the metal contacts, silicidation layers 111 are typically formed over the source/drain regions 105 and the gate electrode 103. The silicidation layers 111 are typically formed by depositing a layer of metal, such as tungsten or cobalt, over the substrate 101 and annealing the wafer. During the annealing process, the deposited metal reacts with the underlying silicon substrate and polysilicon gate electrode to form the silicidation layers 111. The silicidation layers 111 facilitate contact between the metal contacts and the source/drain regions 105 and the gate electrode 103 and also lower the sheet resistance of the source/drain regions 105 and the gate electrode 103.

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). To accomplish these goals, it is desirable to reduce the size of the semiconductor devices without degrading their performance.

As the device is made smaller fabrication complexity typically increases and conventional techniques for fabricating semiconductor devices may give rise to new problems. For instance, conventionally formed silicide layers on small-scale gate electrodes (e.g., 0.18 microns or less) typically have higher sheet resistances than similar silicides on larger gate electrodes. The increase in sheet resistance typically has a significant deleterious impact on device performance. In addition, the narrow width of small scale gate electrodes presents significant contact problems. New semiconductor fabrication processes and devices are there needed to continue the trend of reduced semiconductor device size and increased performance.

SUMMARY OF THE INVENTION

Generally, the present invention relates to a semiconductor device having at least one polysilicon line having an extended silicide layer and a method of fabricating such as device.

In one embodiment of the invention, a polysilicon line is formed on a substrate of the semiconductor device. The polysilicon line may, for example, be a gate electrode. A dielectric layer is formed over the substrate and adjacent the polysilicon line and a patterned metal layer is formed over the polysilicon line. Next, a polysilicon layer is formed over the patterned metal layer and reacted with the patterned metal layer to form a silicide layer over the polysilicon line.

In another embodiment of the invention, a process of forming a semiconductor device is provided in which first and second polysilicon lines are formed on a substrate and a dielectric layer is formed adjacent the first and second polysilicon lines. Next, there is formed a patterned metal layer having first and second metal lines respectively disposed over the first and second polysilicon lines and a portion connecting the first and second metal lines. A polysilicon layer is then formed over the patterned metal layer and reacted with the patterned metal layer to form a silicide layer over the first and second polysilicon lines and interconnecting the first and second polysilicon lines.

A semiconductor device, in accordance with one embodiment of the invention, includes a substrate, at least one polysilicon line having a width disposed over the substrate, and a silicide layer disposed on top of the polysilicon line and having an edge which extends beyond an edge of the polysilicon line by 10% or more of the polysilicon line width. The polysilicon line may, for example, be a gate electrode. The device may further include a second polysilicon line, such as a gate electrode, and the silicide layer may extend over the top of the second polysilicon line and interconnect the two polysilicon lines.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
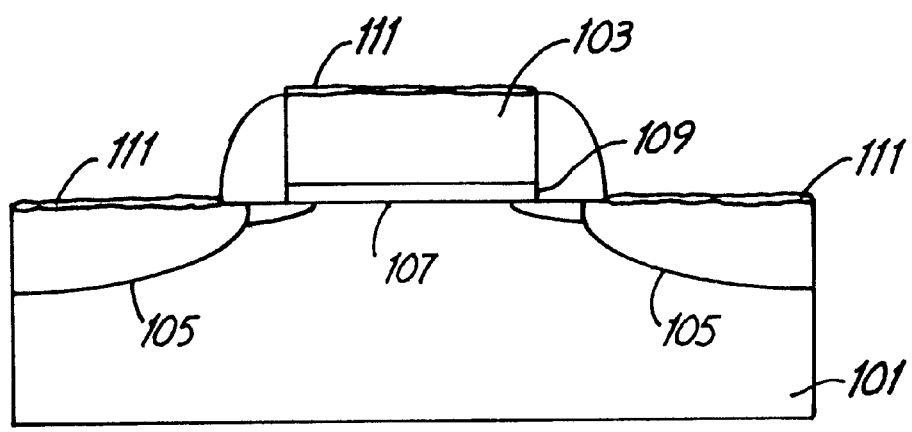
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally applicable to the formation of silicide layers on polysilicon lines in a number of semiconductor devices, including in particular MOS structures, such as PMOS, NMOS, CMOS and BiCMOS device. The invention is particularly suited to the formation of silicide layers on small scale polysilicon lines (e.g., having widths of 0.25 microns or less). While the present invention is not so limited, an appreciation of various aspects of the invention will be gained through a discussion of the fabrication process and characteristics of such a device in connection with the examples provided below.

FIGS. 2A–2F illustrate a process for fabricating a semiconductor device having a polysilicon line with an extended silicide layer. Using known techniques, one or more polysilicon lines (only one of which is shown) are formed on a substrate 201. The polysilicon line 202 generally has a relative narrow width w and depth d as compared to its length. While the invention is not limited to any particular dimensions, typical widths w of the polysilicon line 202 range from about 0.18 to 0.5 microns, and typical depths d range from about 1000 to 3000 angstroms. The polysilicon line 202 may, for example, be used as part of a gate electrode 203 for a MOS device or may be another type of line which extends over the substrate. As should be appreciated when used as a gate electrode 203, the polysilicon line 202 is typically insulated from the substrate by a thin gate insulating layer (not shown), such as an oxide layer.

Figure 2A:
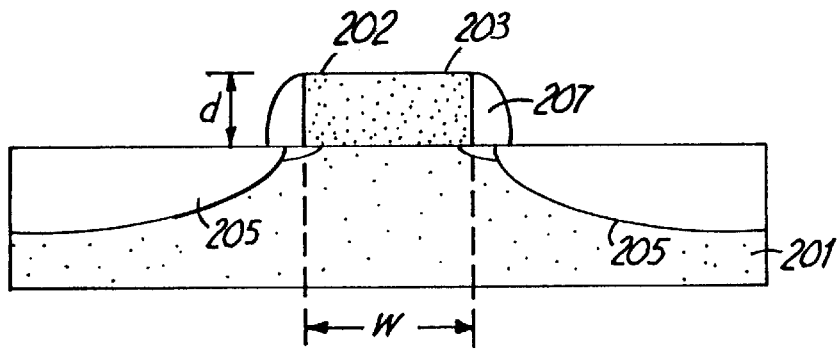
FIGS. 2A–2F and 2C' illustrate a fabrication process in accordance with one embodiment of the invention.

Following formation of the gate electrode 203, source/drain regions 205 may be formed in the substrate 201 adjacent the gate electrode 203. The source/drain regions 205 may, for example, be lightly-doped drain (LDD) source/drain regions formed using well known implantation techniques. Spacers 207 may be formed on sidewalls of the gate electrode 203 during or after the formation of the source/drain regions. The spacers 207 may be formed from a number of different dielectric materials, such as oxides, using known spacer formation techniques. The resultant structure is illustrated in FIG. 2A.

Figure 2B:
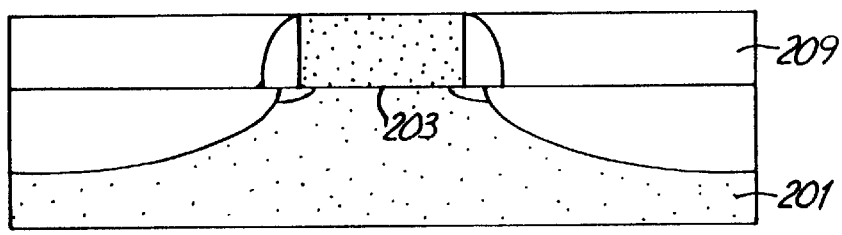

A dielectric layer 209 is formed adjacent the gate electrode 203, as illustrated in FIG. 2B. The dielectric layer 209 may be formed from a number of different dielectric materials, including oxides such as silicon dioxide and silicon oxynitride, for example. The dielectric layer 209 may be formed by depositing a layer of dielectric material over the substrate 201 and planarizing the dielectric material to expose an upper surface of the gate electrode 203. The deposition and planarization may be done using, for example, known deposition and polishing techniques. Planarization of the dielectric layer 209 may be followed by a polish of the gate electrode 203 in order to buff the upper surface of the gate electrode 203. Typically, the planarization of the dielectric layer 209 and polish of the gate electrode 203, if any, are performed using etchants which are selective to the layer being planarized or polished.

A patterned metal layer 211 is formed over the dielectric layer 209 and the gate electrode 203. The patterned metal layer 211 may, for example, be formed by depositing a layer of metal over the substrate 201 and selectively removing portions of the metal layer to form the desired pattern. Selective removal of the metal layer 211 may be carried out using, for example, known photolithography and etching techniques. The patterned metal layer 211 will be used to form an extended silicide layer on the gate electrode 203. The type and thickness of metal is typically selected in consideration of the characteristics of the resultant silicide layer, taking into account any reliability concerns. Suitable metals include cobalt and titanium for many applications. Suitable thicknesses of the patterned metal layer 211 range from 50 to 300 angstroms (Å) for many applications.

Figure 2C:
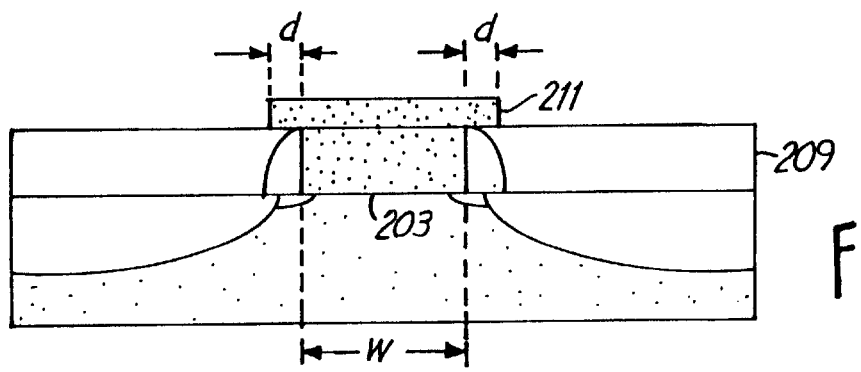

The patterned metal layer 211 typically corresponds to the shape of the underlying gate electrode 203. In accordance with one aspect of the invention, the patterned metal layer 211 extends beyond edges of the gate electrode 203. This overlap allows the extended silicide layer to have a footprint larger than the footprint of the gate electrode 203 and also compensates for any misalignment between the patterned metal layer 211 and the gate electrode 203. The distance d by which the edges of the patterned metal layer 211 may extend beyond the gate electrode 203 is typically selected in consideration of the desired width of the silicide layer. For many applications, the distance d may range from 10 to 50% or more of the width w of gate electrode 203. The resultant structure is illustrated in FIG. 2C. A top view of the resultant structure is shown in FIG. 2C'. While the illustrated patterned metal layer 211 extends a uniform distance d beyond each edge of the gate electrode 203, the present invention is not so limited. Patterned metal layers 211 which are asymmetric with respect to the gate electrode 203 may also be formed.

Figure 2D:
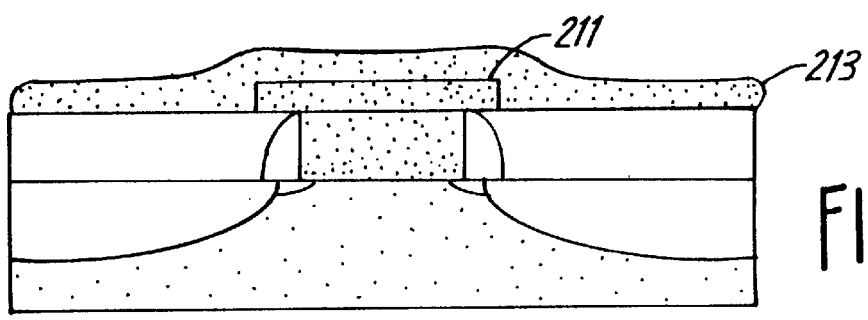

A polysilicon layer 213 is formed over the patterned metal layer 211, as illustrated in FIG. 2D. The polysilicon layer 213 may be formed using, for example, known deposition techniques. The polysilicon layer 213 will be reacted with the underlying patterned metal layer 211 to form an extended silicide layer over the gate electrode 203. The thickness of the polysilicon layer 213 typically depends on the thickness of the patterned metal layer 211 and is typically selected to fully consume the patterned metal layer 211.

Depending on the patterned metal layer 211 thickness, the thickness of the polysilicon layer can range from 250 to 1,000 Å for many applications.

Figure 2E:
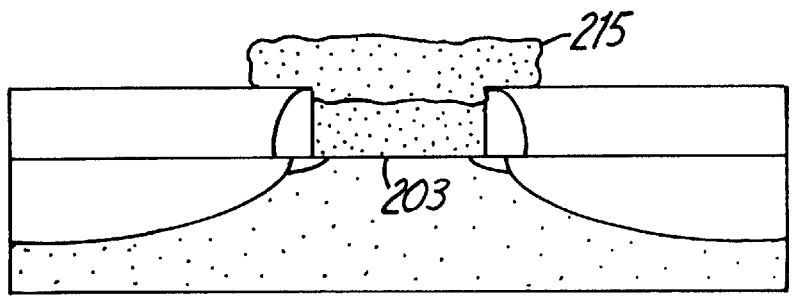
Figure 2F:
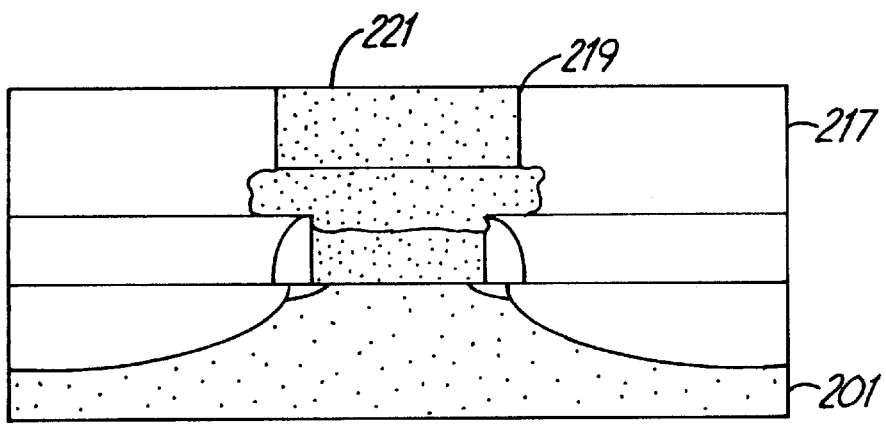

An extended silicide layer 215 is formed on the gate electrode 203 by reacting the polysilicon layer 213 with the underlying patterned metal layer 211. The shape of the extended silicide layer 215 generally corresponds to the shape of the patterned metal layer 211 with the silicide layer 215 being somewhat larger than the patterned metal layer 211. The upper surface of the silicide layer generally has a profile corresponding to that of the underlying gate electrode 203 and dielectric layer 209. Where these features are planar, the silicide layer 215 will have a substantially planar top surface. There may however be a shallow depression above the gate electrode 203 due to consumption of the gate electrode 203 during the silicidation reaction. The resultant structure is illustrated in FIG. 2E. A top view of the structure after silicidation would be similar to that of FIG. 2C' with the patterned metal layer being replaced with a silicide layer. Depending on the amount of by which the patterned metal layer extends beyond the gate electrode, the silicide layer may extend beyond the gate electrode by about 10% to 50% or more of the gate electrode width.

The silicidation process is typically carried out by heating the semiconductor wafer, thereby causing a silicide reaction to occur wherever metal is in contact with silicon or polysilicon. Typically, the silicidation process is performed using a two-step anneal process. First, the semiconductor wafer is annealed at a relatively low temperature (e.g., 450° C.) to cause a silicide reaction. After the first anneal, unreacted portions of the polysilicon layer 213 are then removed. This may be done using known etching techniques, for example. This is followed with a second, higher temperature anneal (e.g., 800° C. to 900° C.) to decrease the sheet resistance of the silicide layer 215. As noted above, during the silicidation process, a small part of the upper surface of the gate electrode 203 is also typically consumed. The use of the polysilicon layer 213 above the patterned metal layer 211, however, prevents excessive consumption of the gate electrode 203 and further increases the reliability of the device.

Following silicidation, a dielectric layer 217 is typically formed over the substrate 201 using known deposition techniques. Portions of the dielectric layer 217 are then removed to form contact openings 219 (only one of which is showing) to the gate electrode 203 and source/drain regions 205. This may be done using known photolithography and etching techniques. The contact openings 219 are then filled with a conductive material 221, such as a metal, to form contacts to the underlying active devices. Fabrication of the device may continue with known processing to complete the ultimate device structure.

Using the above process, an extended silicide layer may be formed on top of a polysilicon line, such as a gate electrode. The extended silicide layer may have a greater width then the polysilicon line, thereby increasing the area for a subsequent contact. The extended silicide layer may also have a lower sheet resistance than conventionally formed silicide layers. This enables the polysilicon line to be scaled down without significantly degrading the operability or reliability of the device. Using the above techniques, reliable silicide layers may, for example, be formed on polysilicon lines having widths of 0.18 microns or less.

FIGS. 3A–3D illustrate a process of forming local interconnects between polysilicon lines using an elevated silicide layer. In accordance with this process, a plurality of polysilicon lines 302 are formed over a substrate 301. The polysilicon lines 302 may be used as gate eletcrodes 303 and may be formed using known techniques. Source/drain region may be formed adjacent each of the gate electrodes 303. While the illustrated gate electrodes 303 share a common source/drain region 305, it should be appreciated that the present invention is not so limited. Isolated gate electrodes may also be locally interconnected using an elevated silicide layer.

Figure 3A:
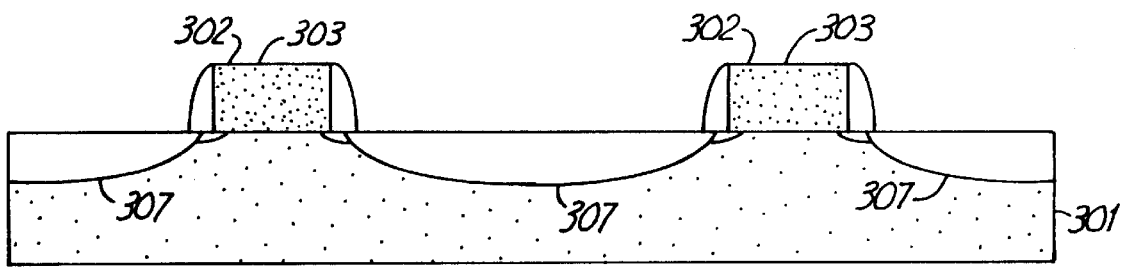
FIGS. 3A–3D and 3B' illustrate another fabrication process in accordance with another embodiment of the invention.
Figure 3B:
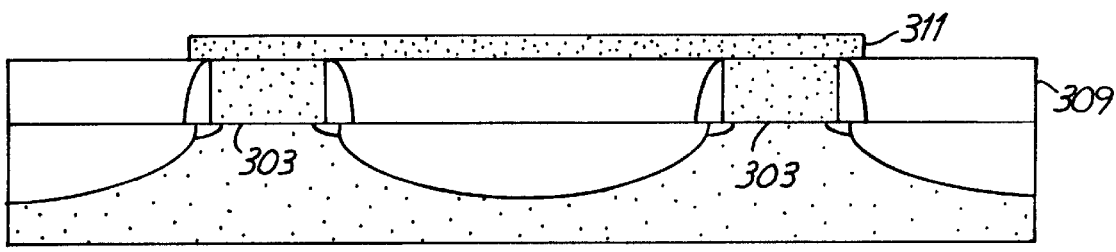

A dielectric layer 309 is formed over the substrate 301 and adjacent the gate electrodes 303. This may be done in a similar manner as discussed above. Following formation of the dielectric layer 309, a patterned metal layer 311 is formed over the dielectric layer 309 and the gate electrodes 303. FIGS. 3B and 3B' illustrate a cross sectional and top views of the resultant structure, respectively. As best shown in FIG. 3B', the patterned metal layer 311 includes two lines 312 each respectively disposed over one of the gate electrode lines 303 and a portion 313 interconnecting the two metal lines 312. The patterned metal layer lines 312 may have edges which extend beyond the edges of the underlying gate electrodes 303, similar to the patterned metal layer 211 discussed above.

Figure 3C:
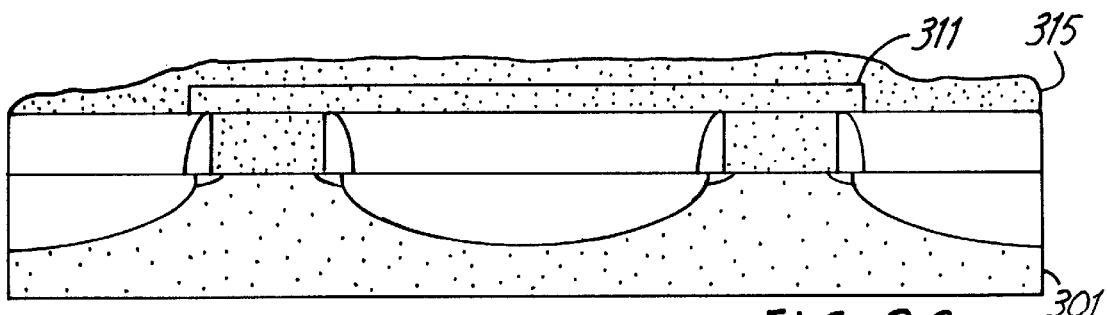
Figure 3D:
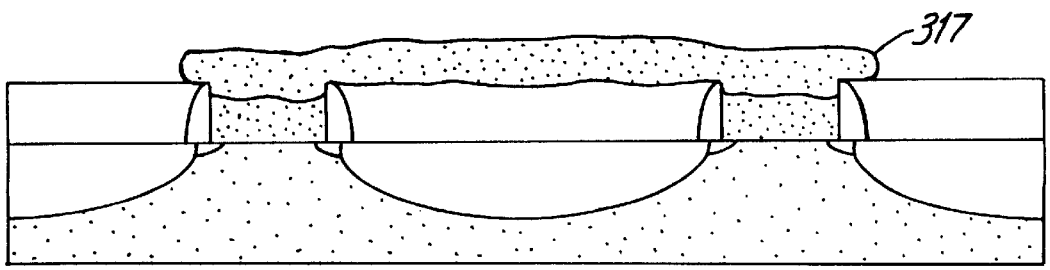
Figure 2C:
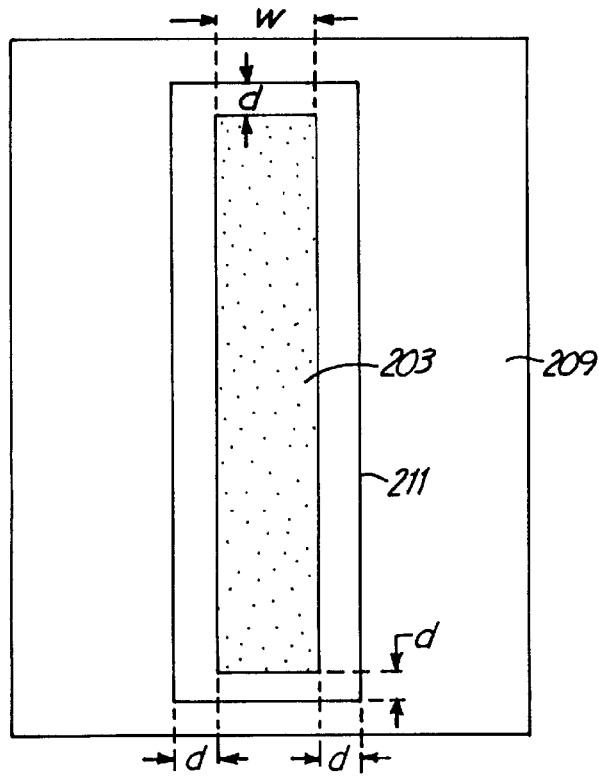
Figure 3B:
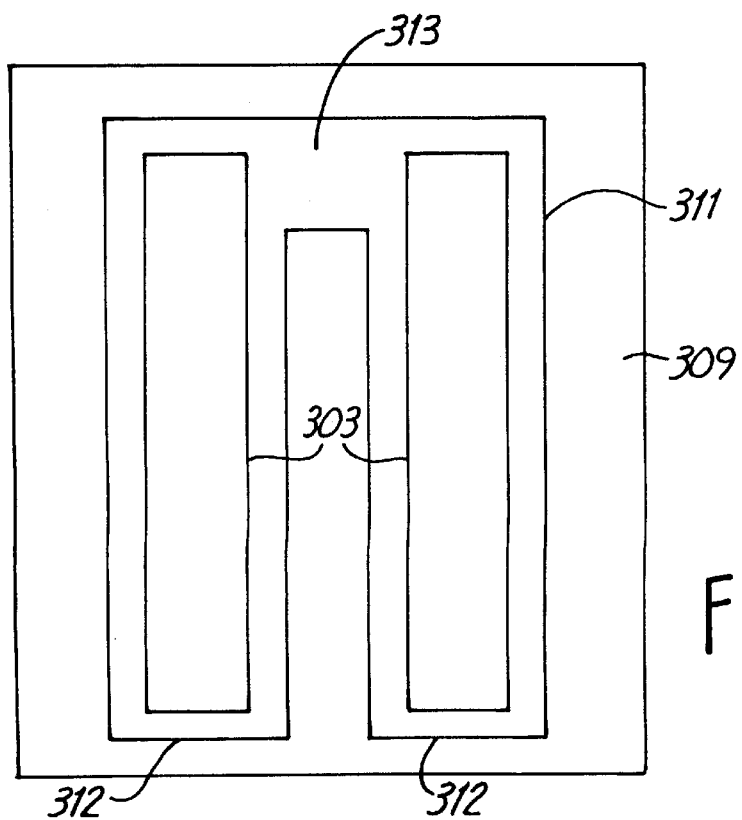

After forming the patterned metal layer 311, a polysilicon layer 315 is formed over the substrate 301 as illustrated in FIG. 3C. The polysilicon layer 315 may be formed in a similar manner as the polysilicon layer discussed above. Next, the polysilicon layer 315 and underlying patterned metal layer 311 are reacted to form a silicide layer 317 which extends over the gate electrodes 303 and interconnects the gate electrodes 303. This may be done in a similar manner as discussed above. FIG. 3D illustrates the resultant structure. A top view of the resultant structure would be similar to that of FIG. 3B' with the patterned metal layer being replaced with a slightly larger silicide layer. The amount by which the silicide layer can extend beyond the edges of the gate electrode depends on the extension of the patterned metal layer 311. Typically, this amount is about 10% to 50% or more of the gate electrode width w. Fabrication of the device may continue with contact formation and so forth to complete the ultimate device structure.

Using the above process, local interconnection between gate electrodes and/or polysilicon lines may be integrally formed with the formation of an extended silicide layer over the structures. The extended silicide layers can provide an increased footprint for subsequent contacts and increase device performance and reliability. The integral formation of local interconnects using the same silicide layer provides additional flexibility in semiconductor fabrication. Moreover, while the above process illustrates the local interconnection of two adjacent polysilicon lines, the present invention is not so limited. More than two such lines and/or non-adjacent lines may be interconnected, if desired.

As noted above, the present invention is applicable to the fabrication of a number of different devices where an extended gate electrode silicide layer is desirable. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:

forming a polysilicon line on a substrate;

forming a dielectric layer over the substrate and adjacent the polysilicon line;

forming a patterned metal layer over the polysilicon line and the dielectric layer said metal layer directly contacting the polysilicon line;

forming a polysilicon layer over the patterned metal layer; and forming a silicide layer over the polysilicon line by reacting the patterned metal layer and the polysilicon layer.

2. The process of claim 1, wherein forming the dielectric layer includes depositing a dielectric material over the substrate and the polysilicon line and polishing the dielectric layer to expose an upper surface of the polysilicon line.

3. The process of claim 1, further including forming source/drain regions adjacent the polysilicon line prior to forming the dielectric layer.

4. The process of claim 1, wherein forming the patterned metal layer includes depositing a metal and selectively etching the metal.

5. The process of claim 1, wherein forming the patterned metal layer includes forming edges of the patterned metal layer which extend beyond edges of the polysilicon line and wherein forming the silicide layer includes forming the silicide layer with edges extending beyond the edges of the polysilicon line.

6. The process of claim 5, wherein the patterned metal layer edges extend beyond the edges of the polysilicon line by about half the width of the polysilicon line.

7. The process of claim 1, wherein the patterned metal layer is formed from cobalt.

8. The process of claim 1, wherein:

forming the polysilicon line includes forming a second polysilicon line;

forming the dielectric layer includes forming the dielectric layer adjacent the second polysilicon line;

forming the patterned metal layer includes forming the patterned metal layer over the second polysilicon line; and forming the silicide layer includes forming the silicide layer over the second polysilicon line;

wherein a portion of the patterned metal layer over the polysilicon line is connected to a portion of the patterned metal layer over the second polysilicon line such that the silicide layer forms a local interconnect between the polysilicon lines.

9. A process of forming a semiconductor device, comprising:

forming a gate electrode on a substrate;

depositing a dielectric layer over the substrate and removing the dielectric layer to expose the gate electrode;

depositing a metal layer over the gate electrode and the dielectric layer said metal layer directly contacting the gate electrode;

selectively etching the metal layer to leave a patterned metal layer having edges extending beyond edges of the gate electrode;

depositing a polysilicon layer over the patterned metal layer; and reacting the patterned metal layer and the polysilicon layer to form a silicide layer over the gate electrode and extending beyond the edges of the gate electrode.

10. The process of claim 9, wherein forming the silicide layer includes reacting the patterned metal layer with a portion of the gate electrode.

11. A process of forming a semiconductor device, comprising:

forming first and second polysilicon lines on a substrate;

forming a dielectric layer over the substrate and adjacent the first and second polysilicon lines;

forming a patterned metal layer having first and second metal lines respectively disposed over and directly contacting the first and second polysilicon lines and a portion connecting the first and second metal lines;

forming a polysilicon layer over the patterned metal layer; and reacting the patterned metal layer and the polysilicon layer to form a silicide layer over the first and second polysilicon lines and interconnecting the first and second polysilicon lines.

* * * * *